United States Patent
Abdallah et al.

(10) Patent No.: US 9,934,980 B2
(45) Date of Patent: Apr. 3, 2018

(54) REWORK AND STRIPPING OF COMPLEX PATTERNING LAYERS USING CHEMICAL MECHANICAL POLISHING

(71) Applicant: International Business Machines Corporation, Armonk, NY (US)

(72) Inventors: Jassem A. Abdallah, Albany, NY (US); Raghuveer R. Patlolla, Guilderland, NY (US); Brown C. Peethala, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 43 days.

(21) Appl. No.: 14/838,491

(22) Filed: Aug. 28, 2015

(65) Prior Publication Data

US 2015/0371863 A1 Dec. 24, 2015

Related U.S. Application Data (63) Continuation of application No. 14/270,565, filed on May 6, 2014, now Pat. No. 9,190,285.

(51) Int. Cl.
*H01L 21/302* (2006.01)
*H01L 21/306* (2006.01)
(Continued)

(52) U.S. Cl.
CPC .... *H01L 21/30625* (2013.01); *H01L 21/3081* (2013.01); *H01L 21/3085* (2013.01);
(Continued)

(58) Field of Classification Search
CPC .......... H01L 21/30625; H01L 21/3086; H01L 21/31133; H01L 21/3085; H01L 21/3081; H01L 21/32139; H01L 21/308; H01L 21/31056; H01L 21/76811; H01L 21/31144; H01L 21/31111; H01L 21/02079
(Continued)

(56) References Cited

U.S. PATENT DOCUMENTS 6,682,607 B1 1/2004 Farino
6,929,901 B2 8/2005 Lui et al.
(Continued)

FOREIGN PATENT DOCUMENTS

TW 201030803 A 8/2010

OTHER PUBLICATIONS

Cruz et al., "Multiple Level Integrated Circuit Rework Using Chemical Mechanical Polish and Reactive Ion Etch", IBM Technical Disclosure Bulletin—pp. 254-255, Jun. 1, 1992.
(Continued)

*Primary Examiner* — Lan Vinh
(74) *Attorney, Agent, or Firm* — Scully, Scott, Murphy & Presser, P.C.; Steven J. Meyers (57) ABSTRACT

A method utilizing a chemical mechanical polishing process to remove a patterned material stack comprising at least one pattern transfer layer and a template layer during a rework process or during a post pattern transfer cleaning process is provided. The pattern in the patterned material stack is formed by pattern transfer of a directed self-assembly pattern generated from microphase separation of a self-assembly material.

17 Claims, 7 Drawing Sheets

(51) Int. Cl.
   *H01L 21/311* (2006.01)
   *H01L 21/768* (2006.01)
   *H01L 21/321* (2006.01)
   *H01L 21/308* (2006.01)
   *H01L 21/3213* (2006.01)
   *H01L 21/02* (2006.01)

(52) U.S. Cl.
   CPC .... *H01L 21/3086* (2013.01); *H01L 21/31111* (2013.01); *H01L 21/31133* (2013.01); *H01L 21/31144* (2013.01); *H01L 21/3212* (2013.01); *H01L 21/32139* (2013.01); *H01L 21/76811* (2013.01); *H01L 21/02079* (2013.01); *H01L 2224/03845* (2013.01)

(58) Field of Classification Search
   USPC ............. 438/635, 692, 693, 635.692, 736; 216/88, 89, 99
   See application file for complete search history.

(56) References Cited

U.S. PATENT DOCUMENTS

| | | |
|---|---|---|
| 8,226,838 B2 | 7/2012 | Cheng et al. |
| 8,263,129 B2 | 9/2012 | DeSimone et al. |
| 8,557,128 B2 | 10/2013 | Millward |
| 9,153,477 B2 * | 10/2015 | Nyhus ................ H01L 23/5226 |
| 9,249,013 B2 * | 2/2016 | Wang .................... B81C 1/0038 |
| 2004/0147108 A1 * | 7/2004 | Lamb, III ............ H01L 21/312 438/622 |
| 2004/0245636 A1 | 12/2004 | Cooney, III et al. |
| 2006/0102208 A1 | 5/2006 | Jacobson et al. |
| 2007/0252186 A1 * | 11/2007 | Yang ....................... H01L 43/12 257/295 |
| 2007/0275565 A1 | 11/2007 | Cooney, III et al. |
| 2011/0076623 A1 | 3/2011 | Fitrianto |
| 2011/0101507 A1 | 5/2011 | Akinmade Yusuff et al. |
| 2011/0117744 A1 | 5/2011 | Ito |
| 2012/0231554 A1 | 9/2012 | Akinmade Yusuff et al. |
| 2014/0335324 A1 | 11/2014 | Kim et al. |
| 2014/0377465 A1 | 12/2014 | Trefonas et al. |
| 2015/0108087 A1 * | 4/2015 | Somervell ................ G03F 7/42 216/47 |

OTHER PUBLICATIONS

Lorsung et al., "Rework Procedure for Oxide Chemical Mechanical Polish with Open Via's Present", IBM Technical Disclosure Bulletin—pp. 503-504, May 1, 1994.

* cited by examiner

REWORK AND STRIPPING OF COMPLEX PATTERNING LAYERS USING CHEMICAL MECHANICAL POLISHING

BACKGROUND

The present disclosure relates to semiconductor device fabrication and, more particularly, to a method of reworking and stripping patterning layers using a chemical mechanical polishing process.

Pattern generation using directed self-assembly (DSA) of polymeric materials is a promising candidate to extend current lithography in sub-20 nm technologies for integrated circuit (IC) manufacture. In a typical DSA process, microphase separation of a block copolymer that is guided by an external field, either chemistry or topography, results in a well-defined pattern with sub-photolithographic resolution. Subsequently, one of the domains is selectively removed, leaving the other domain to serve as a lithographic mask for pattern transfer to underlying resist layers and eventually to the semiconductor devices. However, during the pattern transfer processes, formation of the pattern in the patterning layers may fail, leading to defects in the pattern subsequently formed in the semiconductor devices. Once failure occurs, the patterning layers need to be removed by a rework process. The rework process can include a dry etching process such as an ashing process using an oxygen plasma, or a wet cleaning process using an organic stripper solution. However, in the case of the DSA process, exposed surfaces of the patterning layers might be modified by residues of the block copolymer which makes them difficult to remove with conventional cleaning processes. Therefore, new processing methods for removing patterning layers are needed in the DSA pattern transfer process.

SUMMARY

The present disclosure provides a method utilizing a chemical mechanical polishing process (CMP) to remove a patterned material stack comprising at least one pattern transfer layer and a template layer during a rework process or during a post pattern transfer cleaning process. The pattern in the patterned material stack is formed by pattern transfer of a directed self-assembly pattern generated from microphase separation of a self-assembly material.

In one aspect of the present disclosure, a method for making a semiconductor structure is provided. The method includes first providing a hardmask layer on an uppermost surface of a substrate. A material stack is then formed on the hardmask layer. The material stack includes at least one pattern transfer layer and a template layer present on the pattern transfer layer. After forming at least one opening in the template layer, a patterned structure is formed in the opening. The patterned structure comprises a first self-assembled region and a second self-assembled region. The second self-assembled region is removed to provide a first pattern. The first pattern is defined by the first self-assembled region. Next, the first pattern is transferred into the at least one pattern transfer layer to provide a second pattern. After removing the first self-assembled region, residues of the first self-assembled region, remaining portions of the template layer, remaining portions of the at least one pattern transfer layer are removed from the substrate by performing a chemical mechanical polishing (CMP) process.

DETAILED DESCRIPTION

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

Figure 1:
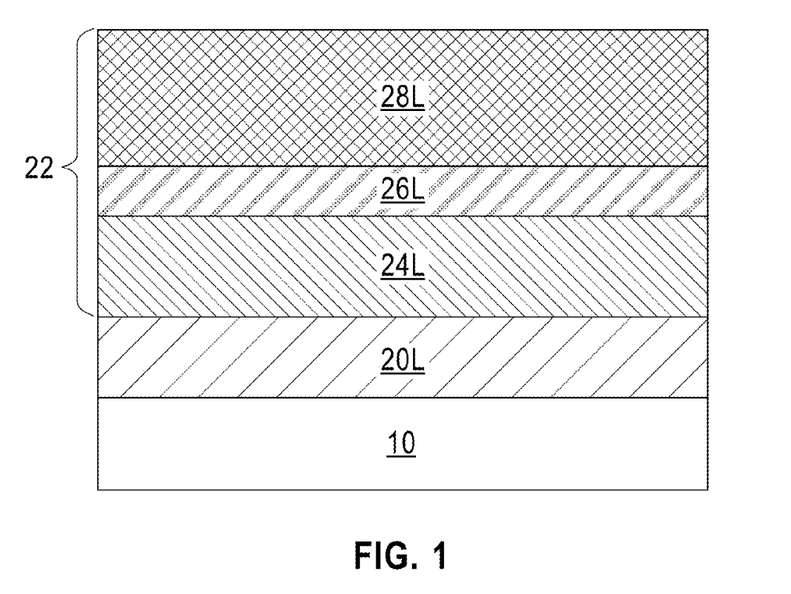
FIG. 1 is a cross-sectional view of an exemplary structure after forming a hardmask layer and a material stack on a substrate according to an embodiment of the present disclosure.

Referring to FIG. 1, there is illustrated an exemplary structure that can be employed in an embodiment of the present disclosure. Specifically, the exemplary structure includes a substrate 10, a hardmask layer 20L present on an uppermost surface of the substrate 10 and a material stack 22 present on an upper surface of the hardmask layer 20L. The material stack 22 typically comprises at least one pattern transfer layer and a template layer 28L present on the at least one pattern transfer layer. In one embodiment, at least one pattern transfer layer comprises, from bottom to top, an organic planarization layer (OPL) 24L and an antireflective coating (ARC) layer 26L. Layers in the material stack 22 are collectively referred to as the patterning layer.

The substrate 10 in the present disclosure can be any substrate conventionally used in processes involving a photoresist. For example, the substrate 10 can be silicon, silicon oxide, aluminum, aluminum oxide, gallium arsenide, ceramic, quartz, copper or any combination thereof including multilayers. The substrate 10 can include one or more semiconductor layers or structures and can include active or operable portions of semiconductor devices.

The hardmask layer 20L provided on the topmost surface of the substrate 10 can include an oxide, nitride, oxynitride or any combination thereof including multilayers. Typically, the hardmask layer 20L is an oxide such as silicon oxide or a nitride such as titanium nitride. The hardmask layer 20L can be formed by conventional deposition processes, such as, for example chemical vapor deposition (CVD), plasma-enhanced CVD (PECVD), physical vapor deposition (PVD) or atomic layer deposition (ALD). The thickness of the hardmask layer 20L can be from 5 nm to 50 nm, although lesser and greater thicknesses can also be employed.

The OPL 24L can be formed on the upper surface of the hardmask layer 20L. The OPL 24L can include near-frictionless carbon (NFC) material, diamond-like carbon, polyarylene ether or polyimide.

The OPL 24L can be formed utilizing any conventional deposition process including, for example, chemical vapor deposition (CVD), plasma enhanced chemical vapor deposition (PECVD), evaporation, spin coating and dip coating. The thickness of the OPL 24L may vary depending on the material as well as the deposition technique used in forming the OPL 24L. The OPL 24L can have a thickness from 50 nm to 500 nm, although lesser and greater thicknesses can also be employed. In one embodiment of the present disclosure, the OPL 24L has a thickness about 135 nm.

The ARC layer 26L can be formed on the upper surface of the OPL layer 24L. The ARC layer 26L can include any ARC conventionally used in processes involving a photoresist. In one embodiment, the ARC layer 26L is a silicon-containing ARC (SiARC) layer having a Si-content of about 43%. The ARC layer 26L can be formed by spin coating, spray coating, dip coating or PECVD. The thickness of the ARC layer 26L can be from 10 nm to 50 nm, although lesser and greater thicknesses can also be employed. In one embodiment of the present disclosure, the ARC layer 26L has a thickness about 20 nm.

The template layer 28L can be formed on the upper surface of the ARC layer 26L. The template layer 28L can include any conventional organic photoresist material, such as, for example, polymethacrylates and polyesters. The template layer 28L can be a single layer or a multilayer structure. In one embodiment, the template layer 28L has a multilayer structure including a vertical stack of a lower OPL and an upper ARC layer. In one embodiment, the lower OPL has a thickness about 50 nm and the upper ARC layer is a SiARC layer having a thickness about 30 nm.

The template layer 28L can be formed utilizing any conventional deposition process including, but not limited to, CVD, PECVD, evaporation, spin coating and dip coating. The thickness of the template layer 28L can be from 10 nm to 300 nm, although lesser or greater thicknesses can also be employed.

Figure 2:
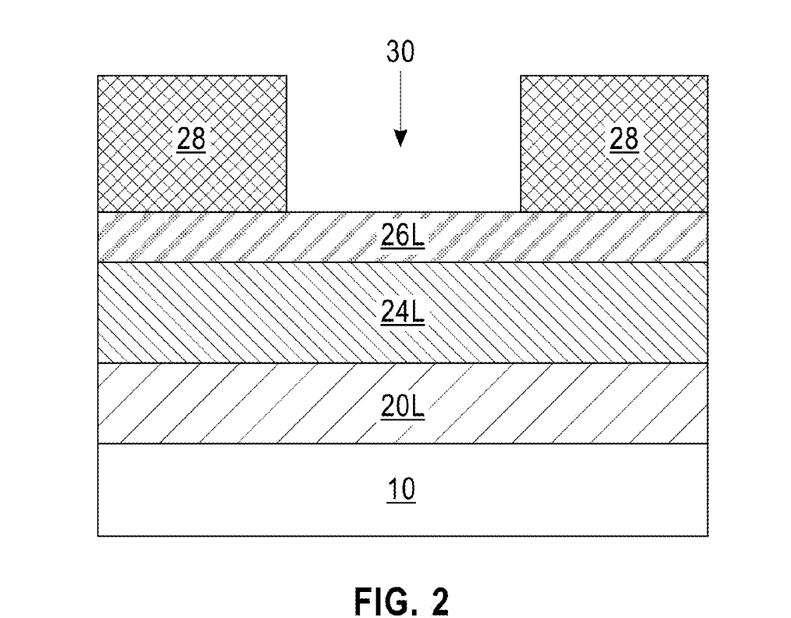
FIG. 2 is a cross-sectional view of the exemplary structure of FIG. 1 after forming an opening in a template layer of the material stack.

Referring to FIG. 2, the template layer 28L is patterned to provide at least one opening 30. The topography of the at least one opening 30 can guide the alignment of a self-assembly material that will be deposited within the opening 30 in the subsequent process.

The at least one opening 30 can be formed utilizing conventional lithography and etching. The lithographic step includes applying a photoresist layer (not shown) atop the template layer 28L utilizing a conventional deposition process, such as, for example, CVD, PECVD and spin coating. Following formation of the photoresist layer, the photoresist layer is exposed to a desired pattern of radiation. Next, the exposed photoresist layer is developed utilizing a conventional resist development process. After the development step, an etching step is performed to transfer the pattern from the patterned photoresist layer into the template layer 28L utilizing the ARC layer 26L as an etch stop. The etching step used in forming the at least one opening 30 comprises a dry etching process, a wet chemical etching process or a combination thereof. Exemplary dry etching processes that can be used in the present disclosure include, but are not limited to, reactive ion etching (RIE), ion beam etching, plasma etching and laser ablation. Typically, RIE is used to form the at least one opening 30. After transferring the pattern into the template layer 28L, the patterned photoresist layer can be removed utilizing a conventional resist stripping process such as, for example, ashing. The at least one opening 30 exposes at least one portion of the ARC layer 26L. Remaining portions of the template layer 28L are herein referred to as patterned template layer 28.

Figure 3:
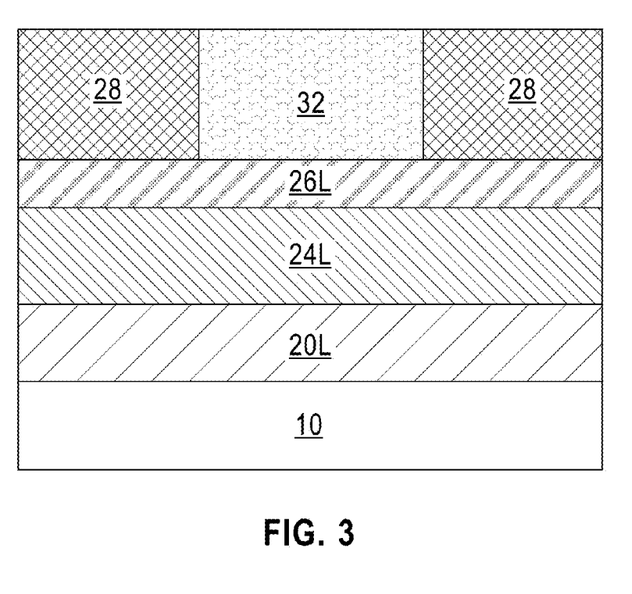
FIG. 3 is a cross-sectional view of the exemplary structure of FIG. 2 after depositing a self-assembly material in the opening.

Referring to FIG. 3, a self-assembly material 32 is deposited in the at least one opening 30 by casting a solution of the self-assembly material over the patterned template layer 28. The solution of the self-assembly material 32 can be cast by any suitable technique, such as, for example, spin coating, roll coating, spraying, ink coating or dip coating. The deposited self-assembly material typically has a thickness less than or equal to a height of the patterned template layer 28.

The self-assembly material 32 can include any material capable of forming a self-assembled periodic pattern. In some embodiments of the present disclosure, the self-assembly material 32 is a block copolymer. Exemplary block copolymers include, but are not limited to, poly(styrene-b-methyl methacrylate), poly(styrene-b-vinyl pyridine), poly (styrene-b-butadiene), poly(styrene-b-isoprene), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly (styrene-b-t-butyl (meth)acrylate), poly(methyl methacrylate-b-t-butyl methacrylate), poly(ethylene oxide-b-propylene oxide), poly(styrene-b-tetrahydrofuran), poly (styrene-b-dimethylsiloxane), poly(styrene-b-ferrocenyldimethylsilane), poly(styrene-b-isoprene-b-ethylene oxide), poly(styrene-b-isoprene-b-methyl methacrylate) and poly(styrene-b-ferrocendimethylsilane-b-isoprene). In one embodiment, the self-assembly material 32 is poly(styrene-b-methyl methacrylate) (PS-b-PMMA).

Figure 4:
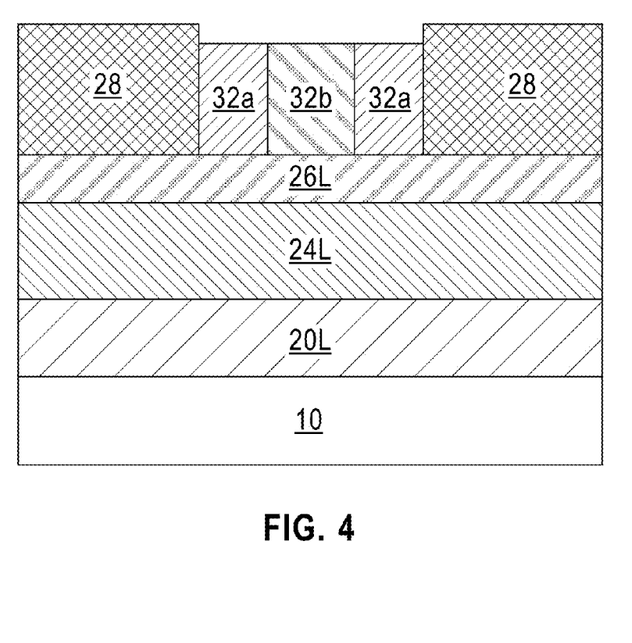
FIG. 4 is a cross-sectional view of the exemplary structure of FIG. 3 after forming a first self-assembled region and a second self-assembled region by microphase separation of the self-assembly material.

Referring to FIG. 4, microphase separation of the self-assembly material 32 provides a first self-assembled region 32a and a second self-assembled region 32b. The first and the second self-assembled regions 32a and 32b comprise different components of the self-assembly material 32. In one embodiment, when the self-assembly material 32 is a block copolymer, the first self-assembled region 32a may contain one block of the block copolymer, and the second-assembled region 32b may contain a different block of the block copolymer. In some embodiments, the microphase separation of the self-assembly material 32 can be facilitated by annealing. Exemplary annealing processes include, but are not limited to, thermal annealing, thermal gradient annealing and solvent vapor annealing. In one embodiment of the present disclosure and as shown in FIG. 4, the microphase separation of the self-assembly layer 32 forms a lamellar pattern with the first self-assembled regions 32a and the second self-assembly 32b oriented perpendicular to the upper surface of the ARC layer 26L. In the lamellar pattern, the first self-assembled region 32a aligns adjacent to each sidewall of the patterned template layer 28 and the second self-assembled region 32b is located between adjacent first self-assembled regions 32a.

Figure 5:
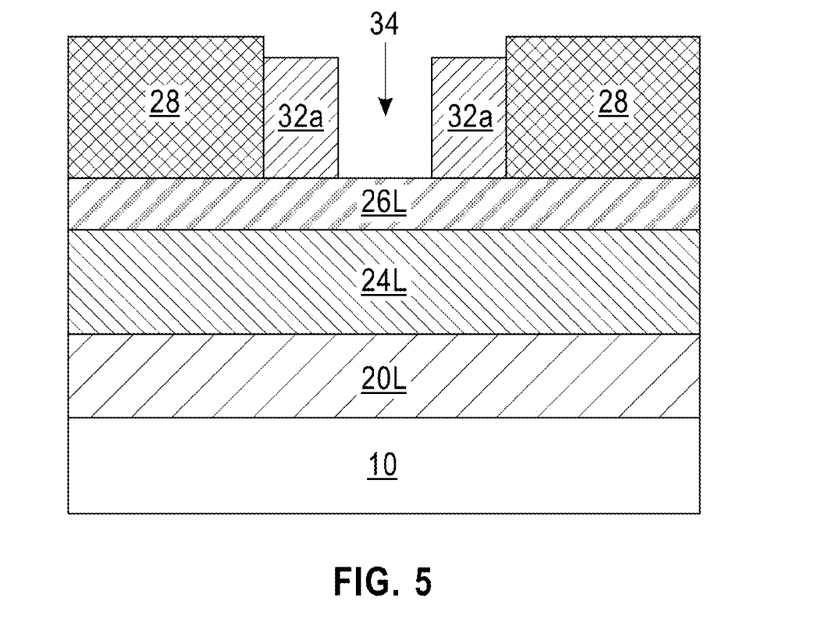
FIG. 5 is a cross-sectional view of the exemplary structure of FIG. 4 after removing the second self-assembled region to provide a first pattern.

Referring to FIG. 5, a first pattern 34 can be formed after removing one of the first self-assembled region 32a or the second self-assembled regions 32b. In one embodiment and as shown in FIG. 5, the second self-assembled region 32b is removed selectively to the first assembled region 32a and the ARC layer 26. The second self-assembled region 32b can be removed by a dry etching process or a wet chemical etching process. In one embodiment, an oxygen plasma is performed to remove the second self-assembled region 32b, while leaving the first self-assembled region 32a intact. The first pattern 34 exposes at least one portion of the upper surface of the ARC layer 26L.

Figure 6:
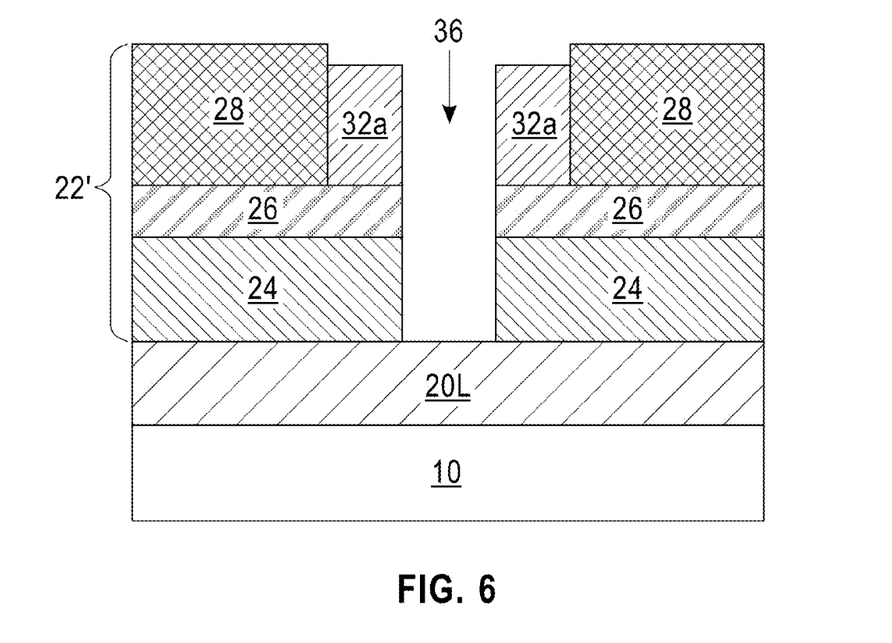
FIG. 6 is a cross-sectional view of the exemplary structure of FIG. 5 after forming a second pattern in the material stack to provide a patterned material stack.

Referring to FIG. 6, the first pattern 34 is transferred into the underlying ARC layer 26L and the OPL layer 24L to provide a second pattern 36. The first pattern 34 can be transferred utilizing at least one etch. In this case, the patterned template layer 28 and the first self-assembled region 32a serve as an etch mask, and the hardmask layer 20L serves as an etch stop. The etch used in forming the second pattern 36 may comprise a dry etching process, a wet chemical etching process or a combination thereof. Exemplary dry etching processes include, but are not limited to, RIE, ion beam etching, plasma etching and laser ablation. Remaining portions of the material stack 22 are herein referred to as patterned material stack 22'. Within the patterned material stack 22, remaining portions of the ARC layer 26L are herein referred to as patterned ARC layer 26, while remaining portions of the OPL 24L are herein referred to as patterned OPL 24.

Figure 7:
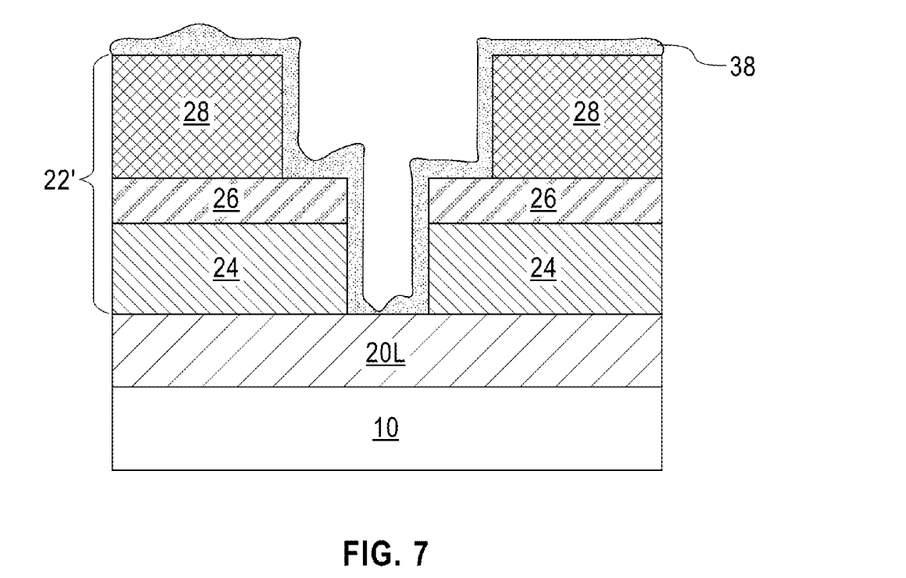
FIG. 7 is a cross-sectional view of the exemplary structure of FIG. 6 after removing the first self-assembled region from the patterned material stack and leaving residues on exposed surfaces of the patterned material stack.

Referring to FIG. 7, when the second pattern 36 is not properly formed, i.e., it contains defects due to conditions of the etch transfer process and exterior variables, the first self-assembled region 32a and the patterned material stack 22' need to be removed from the substrate 10. The first self-assembled region 32a can be removed by a dry etching process or a chemical wet etching process. In one embodiment, the first self-assembled region 32a is removed by a dry etching process. The dry gas includes, but is not limited to, a combination of $H_2$, $N_2$, $O_2$ or $Cl_2$. Residues 38 of the first-assembled region 32a may remain on exposed surfaces of the patterned material stack 22'.

The residues 38 as well as the patterned material stack 22' (i.e., the patterned template layer 28, the patterned ARC layer 26 and the patterned OPL 24) can then be completely removed from the substrate 10 by a chemical mechanical polishing (CMP) process. In the CMP process, a flat soft polishing pad is used with a CMP slurry containing abrasive particles. In one embodiment, the CMP slurry contains silica abrasive particles in an amount from 0.1% to 0.5% by weight with respect to the total weight of the CMP slurry. The CMP slurry may have a pH from 6 to 10.5. The mechanical pressure used in the CMP process can be from 0.5 psi to 2 psi. The CMP process does not affect the underlying hardmask layer 20L. Thus, the hardmask layer 20L remain on the substrate 10 after the CMP process (FIG. 8).

Comparing to the conventional rework process using either dry cleaning or wet chemical cleaning, the CMP process of the present disclosure provides several advantages. First of all, the CMP process eliminates the need for complicated process recipes which are required to remove multiple patterning layers. It also avoids etching related issues that can arise from a conventional rework process, such as roughing of the underlying hardmask layer due to over etching. Moreover, the CMP process is not sensitive to incompatible etch chemistries. Furthermore, by combining chemical and mechanical forces, the CMP process eliminates the concern of rework failure due to end-point trace being out of specification (e.g., failure due to a dose shift in lithography and etching).

Figure 8:
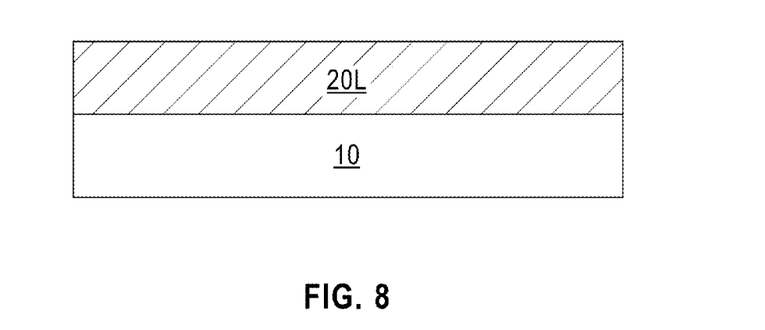
FIG. 8 is a cross-sectional view of the exemplary structure of FIG. 7 after removing residues of the first self-assembled region and the patterned material stack form the hardmask layer using a chemical mechanical polishing (CMP) process.
Figure 9A:
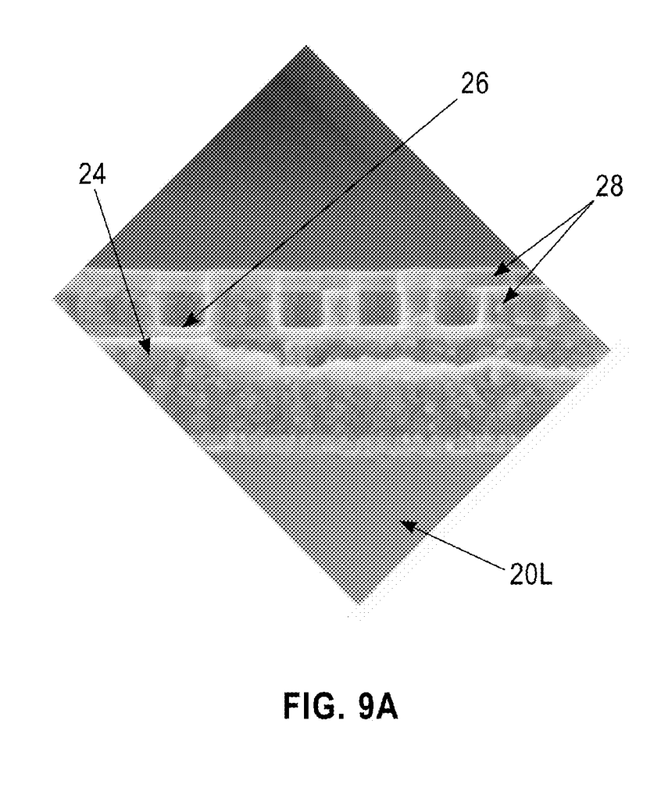
FIGS. 9A and 9B are scanning electron micrograph (SEM) images of the exemplary structure of FIG. 8 before (FIG. 9A) and after (FIG. 9B) the CMP process.
Figure 9B:
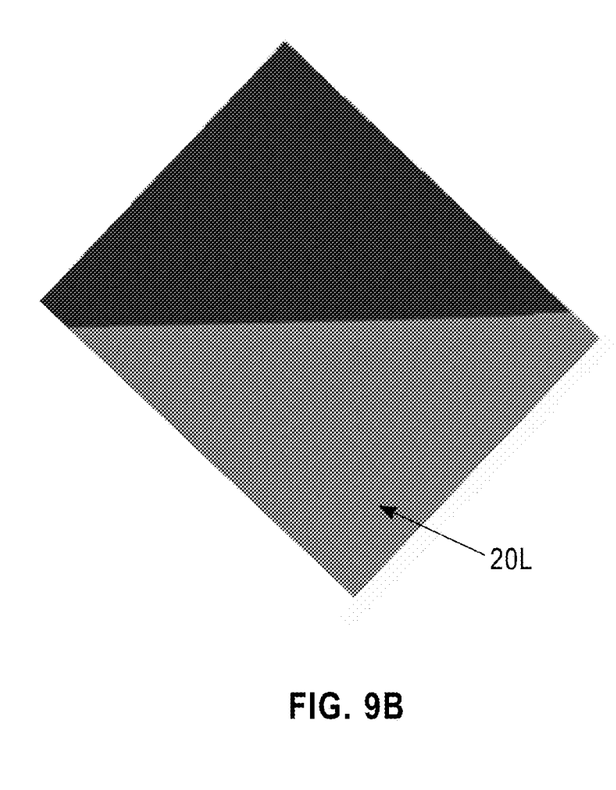

FIGS. 9A and 9B are scanning electron micrograph (SEM) images of the structure of FIG. 8 before (FIG. 9A) and after (FIG. 9B) the CMP process. In one embodiment and as shown in FIG. 9A. a patterned material stack having a multilayer of patterning layers is formed over a hardmask layer 20L. The patterned material stack is composed of, from bottom to top, a 135 nm thick patterned OPL 24, a 20 nm thick patterned SiARC layer 26 and a multilayer patterned template layer 28 including a lower 50 m thick OPL and an upper 30 nm thick SiARC layer. As shown in FIG. 9B, the CMP process removes these pattern transfer layers completely from the upper surface of the hardmask layer 20L and no residues of these pattern transfer layers can be observed after the CMP process.

Figure 10:
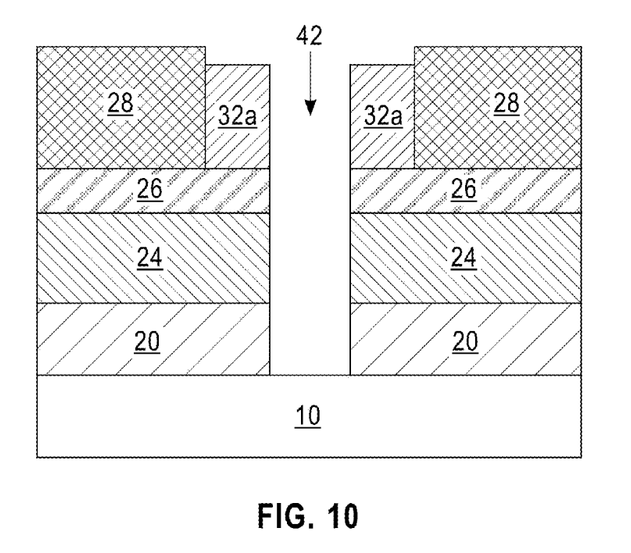
FIG. 10 is a cross-sectional view of the exemplary structure of FIG. 7 after transferring the second pattern into the hardmask layer.
Figure 11:
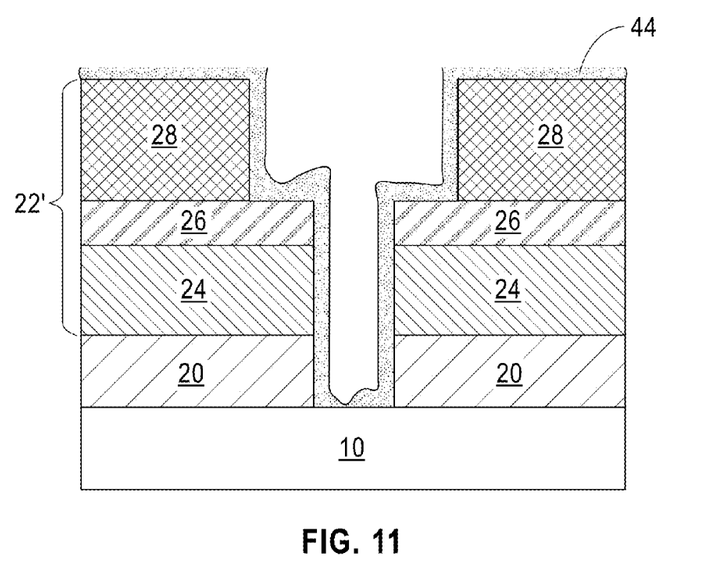
FIG. 11 is a cross-sectional view of the exemplary structure of 10 after removing the first self-assembled region from the patterned material stack and hardmask layer and leaving residues on exposed surfaces of the patterned material stack and the patterned hardmask layer

As shown in FIGS. 10-11, the CMP process described above can also be used in a post pattern transfer cleaning process.

Referring to FIG. 10, when the second pattern 36 is properly formed, the second pattern 36 can be further transferred into the hardmask layer 20L to provide a third pattern 42. The etch used to transfer the second pattern 36 may comprise a dry etching process, a wet chemical etching process or a combination thereof. Typically, RIE is used to transfer the second pattern 36 into the hardmask layer 20L. The RIE gas can be a combination of $Cl_2$, $N_2$, $H_2$, $O_2$ and $CH_xF_y$. Remaining portions of the hardmask layer 20L are herein referred to as patterned hardmask layer 20.

Figure 12:
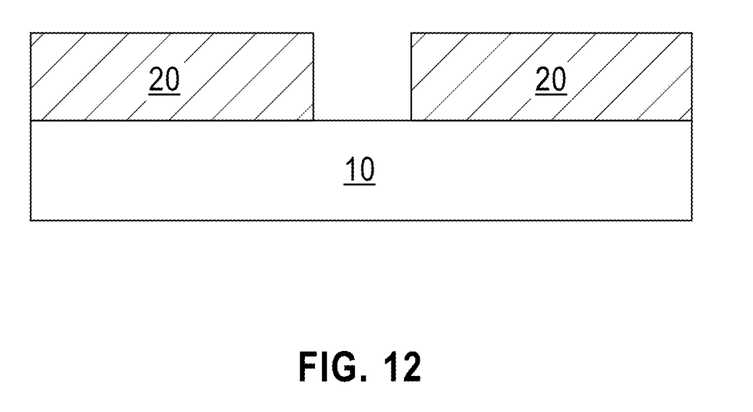
FIG. 12 is a cross-sectional view of the exemplary structure of 10 after removing residues of the first self-assembled region and the patterned material stack from the patterned hardmask layer using a CMP process.

Referring to FIG. 11, after the second pattern 36 is transferred into the hardmask layer 20L, the first self-assembled region 32a can be removed using the same process as described above in FIG. 7. Residues 44 of the first self-assembled region 32a remain on the exposed surfaces of the patterned material stack 22' and the patterned hardmask layer 20 together with the patterned material stack 22' can then be completely removed from the substrate 10 by the CMP process as described above in FIG. 7. The post CMP cleaning process specifically removes any residues including the residues 44 in the patterned hardmask layer 20, but does not affect the patterned hardmask layer 20 (FIG. 12). Thus, as shown in FIG. 12 the patterned hardmask layer 20 remains on the substrate 10 after the CMP process.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for making a semiconductor structure comprising:
    forming a patterned template layer over a pattern transfer layer located on a hardmask layer, wherein the patterned template layer comprises at least one opening exposing a portion of the pattern transfer layer, and wherein the forming the patterned template layer over the pattern transfer layer comprises:
        providing a template layer over the pattern transfer layer,
        forming a photoresist layer on a top surface of the template layer,
        patterning the photoresist layer to define the at least one opening in the photoresist layer, and
        transferring the at least one opening into the template layer,
        wherein the template layer has a multilayer structure comprising an organic planarization layer (OPL) present on the pattern transfer layer and an antireflective coating (ARC) layer present on the OPL;
    forming a patterned structure in the at least one opening, the patterned structure comprising a first self-assembled region and a second self-assembled region;
    removing the second self-assembled region to provide a first pattern, wherein the first pattern is defined by the first self-assembled region;
    transferring the first pattern into the pattern transfer layer to provide a second pattern formed in a patterned pattern transfer layer; and
    performing chemical mechanical polishing (CMP) to remove the first self-assembled region, the patterned template layer and the patterned pattern transfer layer while leaving the hardmask layer unremoved.

2. The method of claim 1, further comprising performing an anisotropic etch to remove a major portion of the first self-assembled region prior to the performing the CMP, wherein the CMP removes a residue of the first self-assembled region that remains on exposed surfaces of the patterned template layer and the patterned pattern transfer layer after performing the anisotropic etch.

3. The method of Claim 1, wherein the ARC layer comprises a SiARC.

4. The method of claim 1, wherein the first self-assembled region comprises a first component of a block copolymer and the second self-assembled region comprises a second component of the block copolymer.

5. The method of claim 4, wherein the block copolymer comprises poly(styrene-b-methyl methacrylate), poly(styrene-b-vinyl pyridine), poly(styrene-b-butadiene), poly(styrene-b-isoprene), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth) acrylate), poly(methyl methacrylate-b-t-butyl methacrylate), poly(ethylene oxide-b-propylene oxide), poly(styrene-b-tetrahydrofuran), poly(styrene-b-dimethylsiloxane), poly(styrene-b-ferrocenyldimethylsilane), poly(styrene-b-isoprene-b-ethylene oxide), poly(styrene-b-isoprene-b-methyl methacrylate), or poly(styrene-b-ferrocendimethylsilane-b-isoprene).

6. The method of claim 1, wherein the hardmask layer comprises titanium nitride or silicon oxide.

7. The method of claim 1, wherein the performing the CMP is conducted under a pressure from 0.5 psi to 2 psi.

8. The method of claim 1, wherein the forming the patterned structure comprises:
    depositing a self-assembly material in the at least one opening; and
    annealing the self-assembly material to cause microphase separation of the self-assembly material, wherein the self-assembly material is a block copolymer.

9. The method of claim 1, wherein the pattern transfer layer comprises another OPL and another ARC present on the another OPL.

10. The method of claim 9, wherein the another OPL comprises near-frictionless carbon (NFC) material, diamond-like carbon, polyarylene ether, or polyimide.

11. The method of claim 9, wherein the another ARC layer comprises a silicon-containing ARC (SiARC).

12. The method of claim 1, wherein the performing the CMP comprises using a CMP slurry.

13. The method of claim 12, wherein the CMP slurry comprises silicon abrasive particles.

14. The method of claim 12, wherein the CMP slurry has a pH value from 6 to 10.5.

15. The method of claim 1, wherein the hardmask layer is present over a substrate.

16. The method of claim 15, wherein the substrate comprises silicon, silicon oxide, aluminum, aluminum oxide, gallium arsenide, ceramic, quartz, or copper.

17. The method of claim 15, further comprising transferring the second pattern into the hardmask layer prior to the performing the CMP.

* * * * *